(12) United States Patent
Huang et al.

(10) Patent No.: US 9,530,868 B2
(45) Date of Patent: Dec. 27, 2016

(54) FIN STRUCTURE AND METHOD OF FORMING THE SAME

(71) Applicant: UNITED MICROELECTRONICS CORP., Hsin-Chu (TW)

(72) Inventors: Nan-Yuan Huang, Tainan (TW); An-Chi Liu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/506,682

(22) Filed: Oct. 5, 2014

(65) Prior Publication Data

US 2016/0056045 A1 Feb. 25, 2016

(30) Foreign Application Priority Data

Aug. 22, 2014 (CN) .......................... 2014 1 0416418

(51) Int. Cl.
| | |
|---|---|
| *H01L 21/762* | (2006.01) |
| *H01L 21/311* | (2006.01) |
| *H01L 29/66* | (2006.01) |
| *H01L 29/06* | (2006.01) |
| *H01L 29/78* | (2006.01) |
| *H01L 21/3065* | (2006.01) |
| *H01L 21/308* | (2006.01) |

(52) U.S. Cl.
CPC ..... *H01L 29/66795* (2013.01); *H01L 21/3065* (2013.01); *H01L 21/3086* (2013.01); *H01L 21/31138* (2013.01); *H01L 29/0653* (2013.01); *H01L 29/0657* (2013.01); *H01L 29/785* (2013.01)

(58) Field of Classification Search
CPC ........... H01L 27/228; H01L 21/823431; H01L 29/66795; H01L 29/0653; H01L 29/0657; H01L 29/785; H01L 21/3086; H01L 21/3065; H01L 21/31138
USPC ....................................... 438/3; 257/E21.002
See application file for complete search history.

(56) References Cited

U.S. PATENT DOCUMENTS

| | | | |
|---|---|---|---|
| 8,338,305 B2 | 12/2012 | Chen et al. | |
| 8,507,384 B2 | 8/2013 | Zhu | |
| 8,603,896 B2 | 12/2013 | Gaudin et al. | |
| 8,658,541 B2 | 2/2014 | Lee et al. | |
| 8,697,339 B2 | 4/2014 | Zhuang et al. | |
| 8,697,515 B2 | 4/2014 | Yin et al. | |
| 2013/0174103 A1 | 7/2013 | Shieh et al. | |
| 2013/0277759 A1 | 10/2013 | Chen et al. | |
| 2013/0330889 A1 | 12/2013 | Yin et al. | |
| 2013/0330906 A1 | 12/2013 | Yu et al. | |
| 2015/0115371 A1* | 4/2015 | Ganz ..................... | H01L 21/266 257/401 |
| 2016/0005866 A1* | 1/2016 | Wu ..................... | H01L 29/7851 257/401 |

\* cited by examiner

*Primary Examiner* — Thomas L Dickey
*Assistant Examiner* — Changhyun Yi
(74) *Attorney, Agent, or Firm* — Winston Hsu; Scott Margo

(57) ABSTRACT

A fin structure and a method of forming the same, where the fin structure includes a fin and a protrusion having irregular shape. The fin and the protrusion are both formed on a substrate, and the protrusion has a height less than that of the fin. With such arrangement, the fin structure of the present invention, as well as the method of forming the same, can achieve the purpose of keeping the fin from collapsing and over etching.

19 Claims, 6 Drawing Sheets

FIN STRUCTURE AND METHOD OF FORMING THE SAME

BACKGROUND OF THE INVENTION

1. Field of the Invention

The present invention relates to a fin structure and a method of forming the same, and more particularly to a fin structure having irregular shape and a method of forming the same.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non planar FETs, such as the fin field effect transistor (Fin FET) have three-dimensional structure, not only capable of increasing the contact to the gate but also improving the controlling of the channel region, such that the non planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

Hence, the fin structure and method of forming the same does still not fully meet the demand of the product, and requires further improvement.

SUMMARY OF THE INVENTION

It is one of the primary objectives of the present invention to provide a method for solving the aforementioned issues, so as to form the fin structure having better efficiency.

It is one of the primary objectives of the present invention to provide a fin structure, which can achieve better efficiency.

To achieve the purpose described above, the present invention provides a method of forming a fin structure, comprising following steps. First of all, a first fin and a second fin are formed on a substrate. Next, a first etching process is performed to remove a portion of the second fin. After that, a second etching process is performed to remove another portion of the second fin and to form an irregular shape on the second fin. Finally, a third etching process is performed to further remove another portion of the second fin and to form a protrusion, wherein the protrusion has a height smaller than a height of the first fin.

To achieve the purpose described above, the present invention also provides a fin structure including a fin and a protrusion. The fin and the protrusion are both disposed on a substrate, wherein the protrusion has an irregular shape and a height smaller than a height of the fin.

The method of forming the fin structure according to the present invention removes the dummy fins progressively through a series fin cutting process. In addition, in the second stage of the series fin cutting process, an etchant having relative higher etching selectivity than the silicon substrate is applied, so as to improve the etching effect of the dummy fins. Thus, through the method of the present invention, the dummy fins can be effectively removed. Meanwhile it is sufficient to keep the fin from collapsing or over-etching during the fin cutting process. Furthermore, through the method of the present invention, a fin structure having irregular shape can be formed, which can achieve better efficiency.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
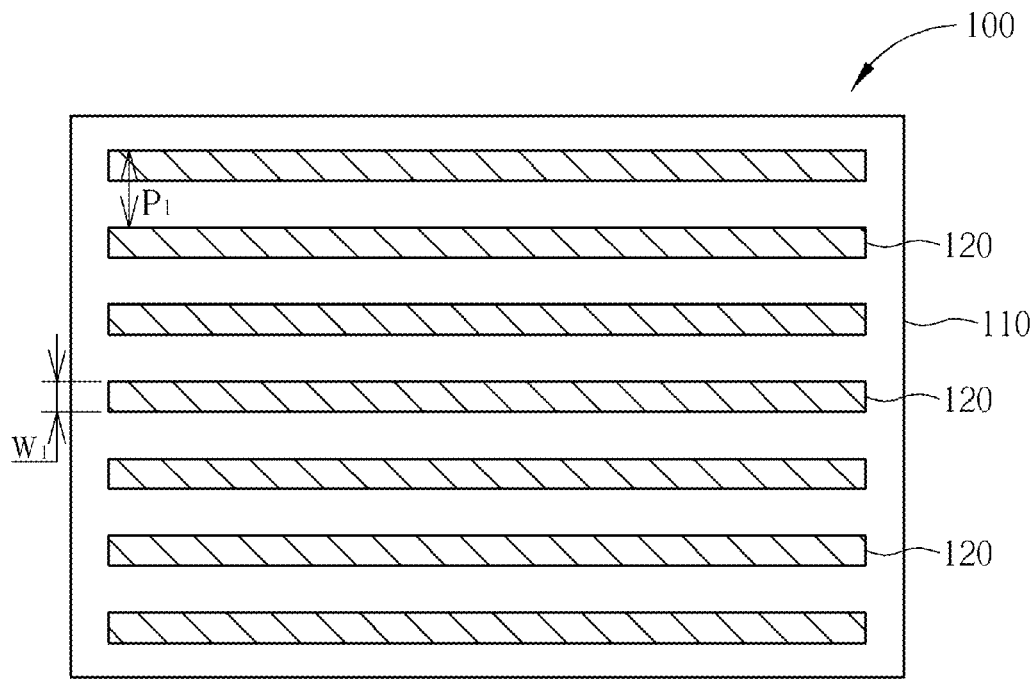
FIG. 1 to FIG. 9 are schematic diagrams illustrating a method of forming a fin structure according to a preferred embodiment of the present invention.
Figure 2:
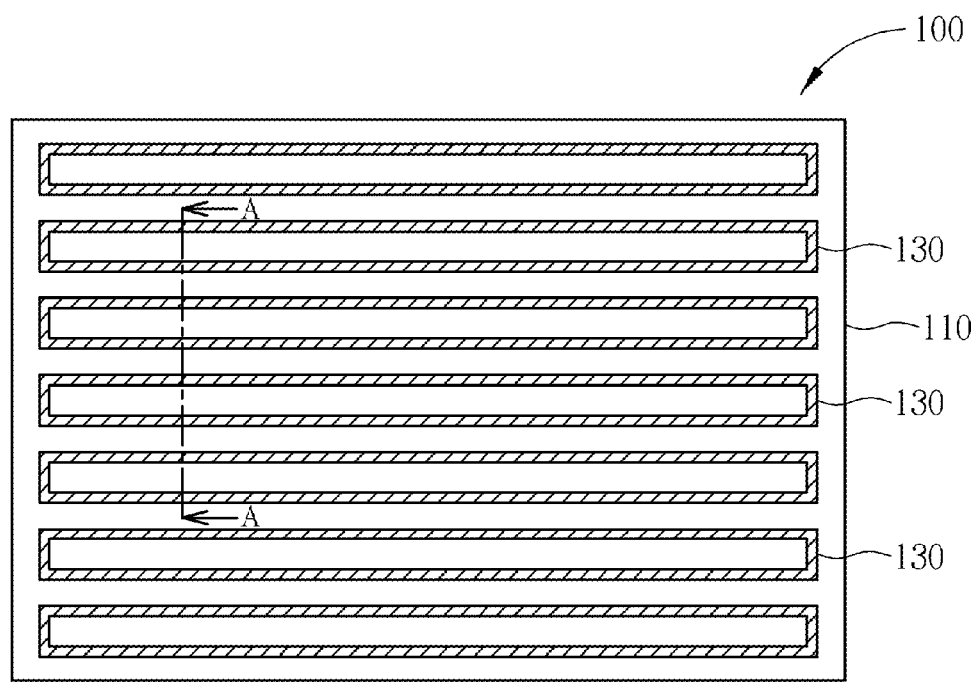
Figure 3:
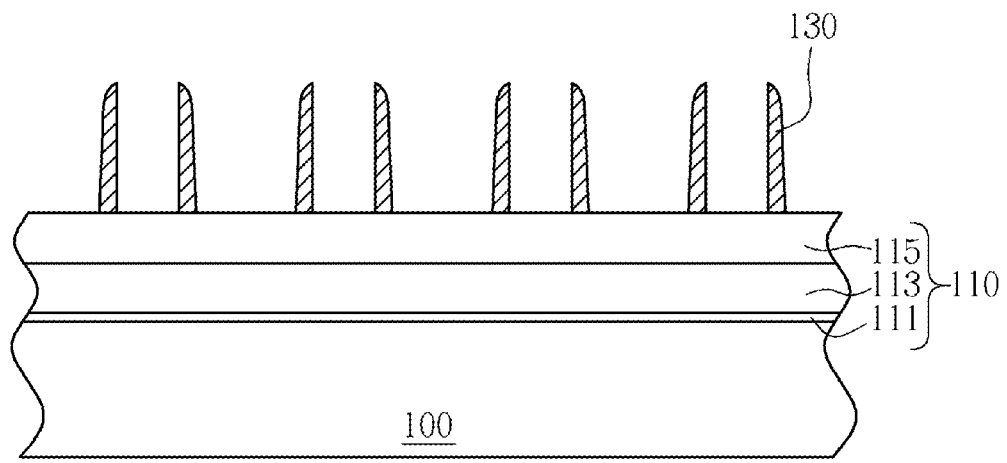
Figure 4:
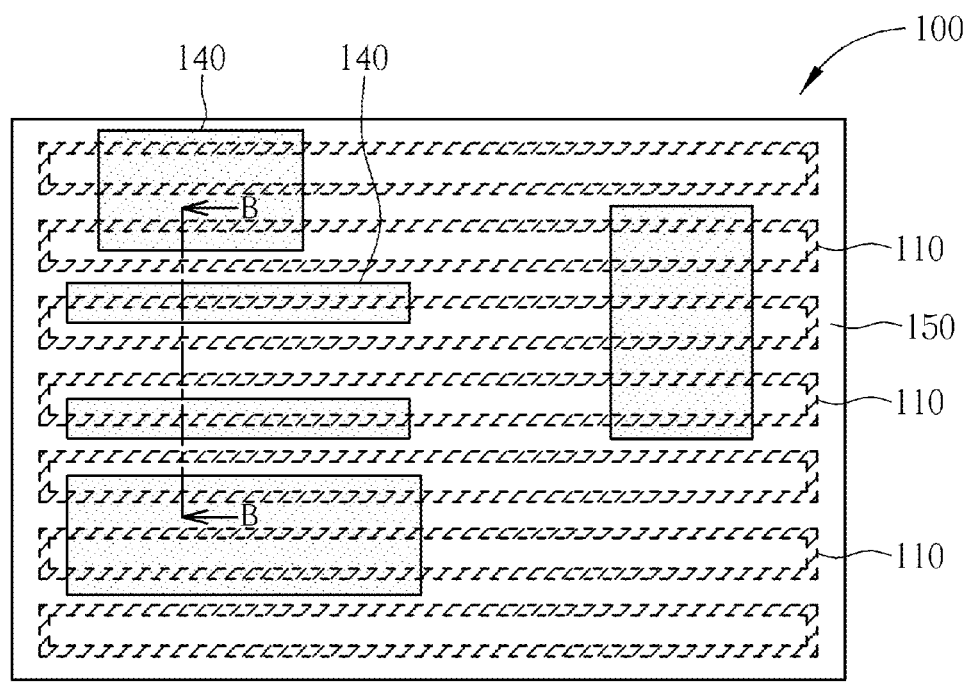
Figure 5:
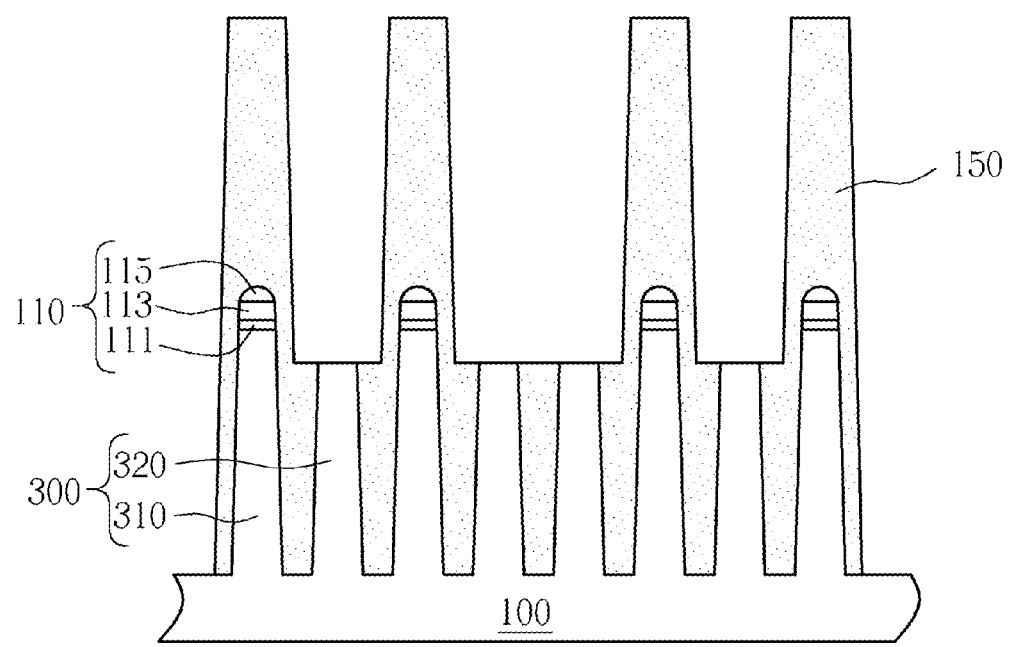

FIG. 1 to FIG. 9 are schematic diagrams illustrating a method of forming a fin structure according to a preferred embodiment of the present invention, wherein, FIGS. 1, 2 and 4 are schematic top views illustrating the fin structure in each forming step; FIGS. 3 and 5 are schematic cross sectional views taken along the cross line A-A in FIG. 2 and the cross line B-B in FIG. 4 respectively; and others are schematic cross sectional views of the fin structure in forming steps.

Referring to FIGS. 1-3, firstly, a substrate 100 is provided, and a hard mask layer 110 is formed on the substrate 100. Precisely speaking, the substrate 100 for example is a semiconductor substrate, including silicon substrate, silicon germanium substrate, silicon carbide substrate, or silicon on insulator (SOI). The hard mask layer 110 is entirely formed on a top surface of the substrate 100, for example, through a chemical vapor deposition (CVD) process or a physical vapor deposition (PVD) process. The hard mask layer 110 may include a single layer structure or a multi-layer structure, such as including a multi-layer structure having oxide layer and a nitride layer. In the present embodiment, the hard mask layer 110 includes a first hard mask layer 111, such as a silicon oxide layer, a second hard mask layer 113, such as a silicon nitride layer, and a third hard mask layer 115, such as a silicon oxide layer, but not limited thereto.

Next, as shown in FIG. 1, a plurality of mandrels 120 are formed on the hard mask layer 110 of the substrate 100. In the present embodiment, the method of forming the mandrels 120 may be integrated into a conventional semiconductor process. For example, a general gate process may be performed to form a plurality of gate patterns which are configured to the mandrels 120 on the substrate 100, but the present invention is not limited thereto. In addition, the material of the mandrels 120 may be polysilicon, or other suitable materials, such as silicon oxide or silicon nitride. Precisely speaking, each of the mandrels 120 is spaced from each other, such that a pitch P1 is performed between any two adjacent mandrels 120. It is worth mentioning that, the pitch P1 is at least greater than the width W1 of the mandrels 120, for example, being 80 micrometers to 100 micrometers, but not limited thereto.

Then, a spacer material layer (not shown in the drawing) is formed on the hard mask layer 110 entirely, covering each of the mandrels 120. After that, an etching back process is performed to remove a portion of the spacer material layer, to expose a portion of the hard mask layer 110 and to form a plurality of spacers 130 surrounding each mandrel 120 respectively. In the present embodiment, the method of forming the spacers 130 may be integrated into the aforementioned gate process, to form the spacers 130 including nitride material, but not limited thereto. In another embodiment, the spacers may include other materials having etching selectivity to the material of the mandrels 120, and be formed through another process.

Then, as shown in FIG. 2 and FIG. 3, FIG. 3 is a schematic cross-sectional view taken along the cross line A-A in FIG. 2. The mandrels 120 are removed, so that the closed rectangular frames of the spacers 130 remain on the hard mask layer 110 of the substrate 100. It is worth noting that the spacers 130 have a width less than the width W1 of the mandrels 120. Then, the pattern of the spacers 130 is transferred to the substrate 100 by using the spacers 130 as an etching mask, to form a primary fin-shaped structures (not shown in the drawing) in the substrate 100. For example, at least one of the dry etching and wet etching process is performed, or the dry etching and wet etching process are performed sequentially, to progressively or one-off directly transfer the pattern of the spacers 130 to the hard mask layer 110 and the substrate 100 underneath, to form the primary fin-shaped structures. The primary fin-shaped structures have the same layout pattern to the spacers 130. After that, the spacers 130 are removed. However, the present invention is not limited thereto.

After the primary fin-shaped structures are formed, a fin cut process is then performed as shown in FIGS. 4-8, to remove unnecessary fins, such as dummy fins and the connection portion at the two ends thereof.

Firstly, as shown in FIG. 4, an organic dielectric layer (ODL) 150 is optionally formed on the substrate 100 entirely, and the organic dielectric layer 150 is patterned. Precisely speaking, the organic dielectric layer 150 entirely covers each fin 300 of the primary fin-shaped structures and fills in the space between each fin 300. Next, a patterned mask layer 140, such as a photoresist layer, is formed on the organic dielectric layer 150, and a removing process, such as a dry etching process, is performed by using the mask layer 140 on the organic dielectric layer 150 as an etching mask, to remove a portion of the organic dielectric layer 150 outside the mask layer 140 and to partially remove the corresponding fins 320 underneath, and to remain (not to etch) a portion of the organic dielectric layer 150 and the fin 310 under the mask layer 140, as shown in FIG. 5. After that, the mask layer 140 is removed. It is worth noting that, a pattern transferring process is firstly performed in this step, to transfer the pattern of the mask layer 140 to the organic dielectric layer 150 and the primary fin-shaped structures, such that the primary fin-shaped structures will include the same layout pattern to the mask layer 140. In addition, at least a portion of the hard mask layer 110 on the corresponding fins 320 below the mask layer 140 is removed in the removing process simultaneously, so as to expose the corresponding fins 320. In other words, only two materials, namely the patterned organic dielectric layer 150 and the fins 320 exposed therefrom, are exposed from the substrate 100 at this step.

As following, the cutting process of those fins 320 is further performed through a series etching process. In the present embodiment, the cutting process of fin mainly utilizes etchants having different etching selectivity (related to the organic dielectric layer 150 and the fins 320), thereby cutting the fin progressively. For example, the series etching process includes three steps of etching processes, including a first etching process, a second etching process and a third etching, and different etchants are used in the three steps of etching processes.

Figure 6:
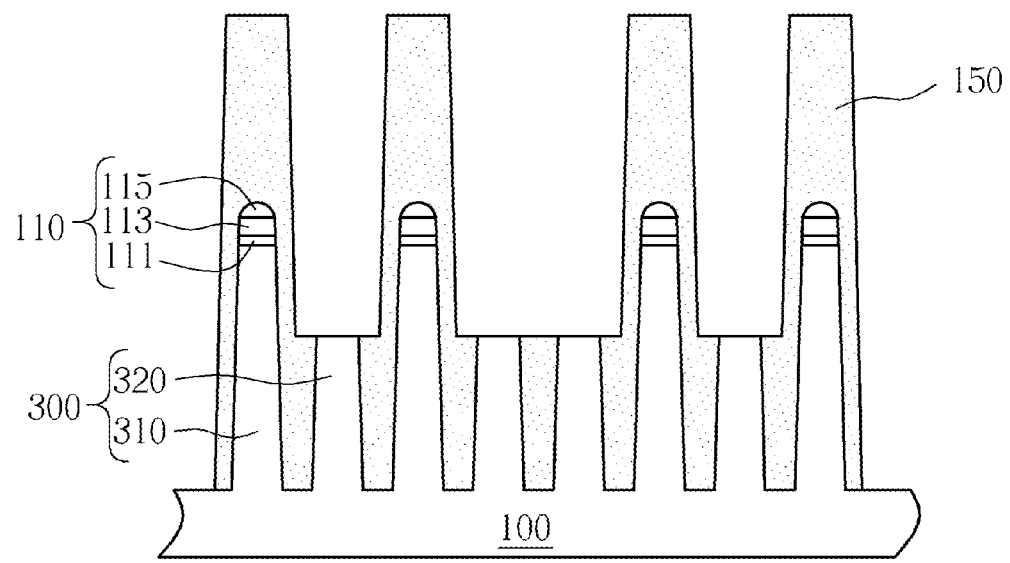

The first etching process, such as a dry etching process, is performed by using a first etchant primarily. The first etchant has the same selectivity related to the silicon substrate (such as fins 320) and the oxide (organic dielectric layer 150). In other words, the first etchant may etch exposed fins 320 and exposed portion of the organic dielectric layer 150 simultaneously, as shown in FIG. 6. In one embodiment, the first etchant may include halogen, such as carbon tetrafluoride ($CF_4$), trifluoromethane ($CHF_3$), difluoromethane ($CH_2F_2$), tetrafluoromethane, or fluoromethane ($CH_3F$) or a combination thereof, and oxygen, but not limited thereto.

Figure 7:
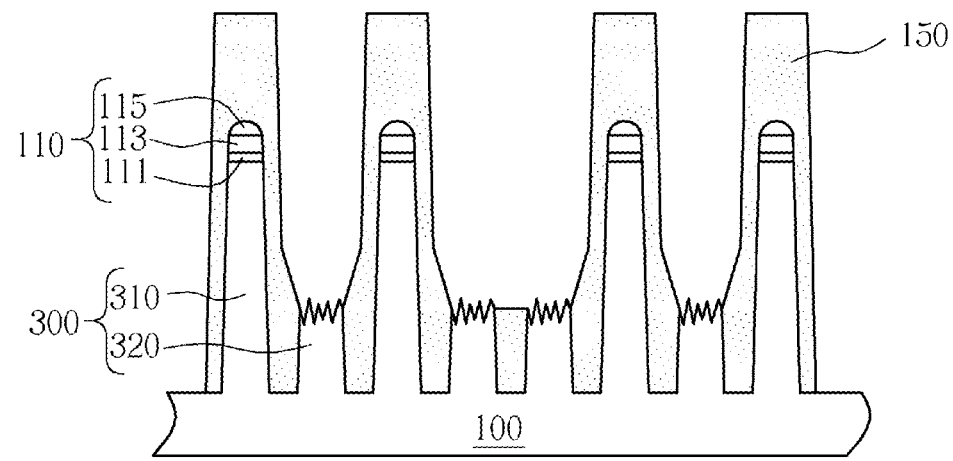

Then, the second etching process is performed by using a second etchant. The second etchant has relative higher etching selectivity than the silicon substrate. In other words, the second etchant will further etch the exposed fins 320, as shown in FIG. 7. Please note that, since the second etchant has relatively lower etching selectivity than oxide (organic dielectric layer 150), the opening of the organic dielectric layer 150 may shrink inwardly and down to reduce the replacement between the second etchant at the bottom of the opening and the etching residue. Also, in view of the ingredient of the second etchant, the second etchant not only can further remove another portion of the fins 320, also resulting in irregular shape, such as irregular surfaces and especially an irregular top surface, of the fins 320 after etching. In one embodiment, the second etchant may include hydrogen bromide (HBr), hydrogen chloride (HCl), chlorine ($Cl_2$), bromine ($Br_2$) or a combination thereof, and an extreme small amount of hydrogen, wherein a volume ratio of the hydrogen bromide or hydrogen chloride is substantially between 65% and 85%, but not limited thereto.

Figure 8:
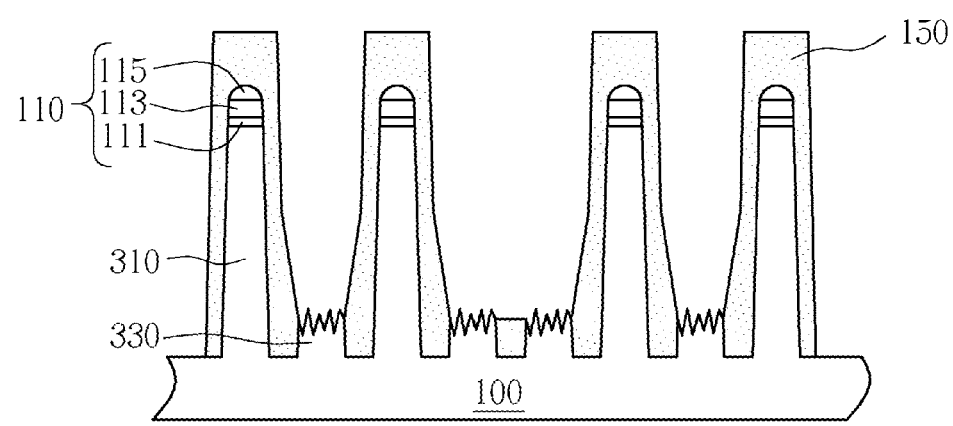

After that, the third etching process is performed, by using a third etchant primarily. The material of the third etchant is substantially the same as that of the first etchant, and has the same selectivity related to the silicon substrate and the oxide. Thus, in the third etching process, the exposed fins 320 and the organic dielectric layer 150 will be etched continuously, as shown in FIG. 8. In other words, similar to the first etching process, in addition to further etching another portion of the fins 320 to form a plurality of protrusions 330 having irregular shape in the substrate 100, another portion of the organic dielectric layer 150 will be further etched simultaneously in the third etching process. In one embodiment, the third etchant preferably includes the same ingredients as the first etchant but in different ratio. For example, the first etchant includes $CF_4/CHF_3/O_2$ in a volume ratio of 100:100:15 and the third etchant includes $CF_4/CHF_3/O_2$ in a volume ratio of 66:100:10, but the present invention is not limited thereto. In another embodiment, the third etchant may also include the same ingredient in the same ratio as the first etchant optionally, or include complete different ingredient.

Figure 9:
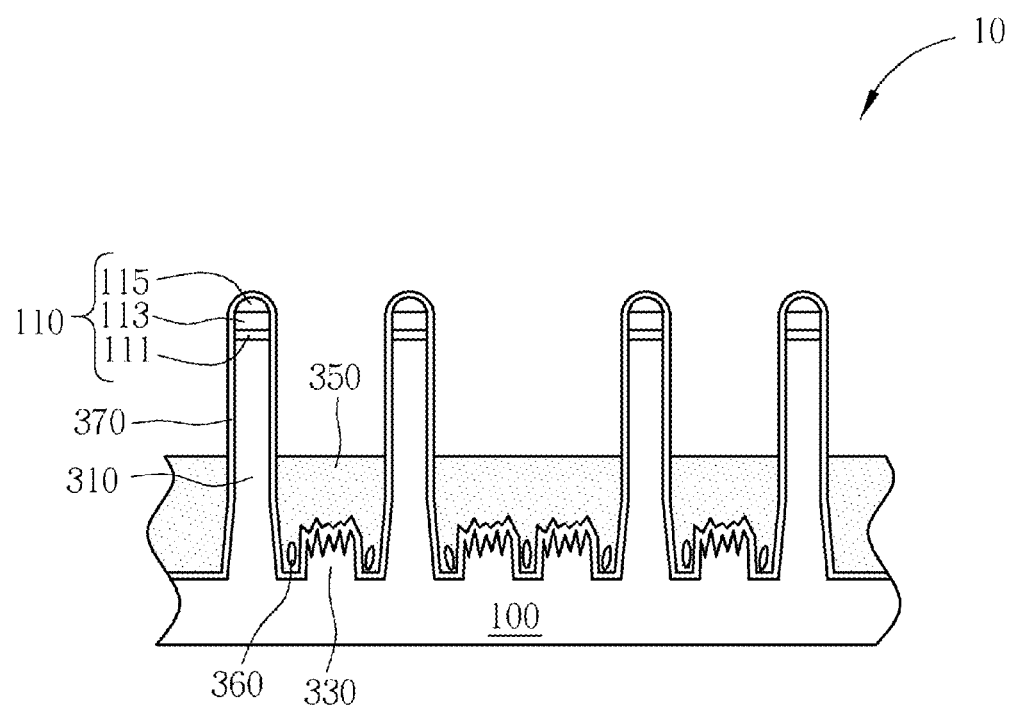

As shown in FIG. 9, after the organic dielectric layer 150 is completely removed, an insulation material (not shown in the drawings) is filled in a space between the fins 310 and the protrusions 330, to form an insulation layer 130. Precisely speaking, the insulation material directly covers the fins 310 and the protrusions 330, and then a suitable planarization process, such as a chemical mechanical planarization or polishing (CMP) process may be optionally performed on the insulation material, by using the hard mask layer 110 on the fin 310 as an etching stop layer firstly to remove a portion of the insulation material, and an etching back process is then performed to formed the insulation layer 350 between each fin 310, wherein the insulation layer 350 may be configured as a shallow trench isolation (STI). It is worth noting that, the fins 310 may have a height at least three times greater than a height of the protrusion 330s, such that the insulation layer 350 may completely cover the protrusions 330, but only partially cover the side wall of each fin 310, with a portion of the each fin 310 being protruded from the insulation layer 350. In one embodiment, the hard mask layer 110 on the fin 310 may be optionally removed after the insulation layer 350 is formed, and then the method of the present invention can integrated into a general semiconductor process, to form a gate electrode (not shown in the drawings) on the fins 310, with the aforementioned gate electrode being served as a tri-gate structure, but not limited thereto. In another embodiment, the hard mask layer on the fin 310 may also be not removed from the fins 310, such that a gate electrode formed on the fin 310 can serve as a dual-gate structure.

In addition, since there is an obvious aspect ratio between the protrusions 330 and the fins 310, a plurality of voids are easy to be formed adjacent to the protrusions 330 or between the protrusions 330 and the fins 310, during filling the insulation material, but not limited thereto.

Furthermore, in another embodiment of the present invention, a thermal oxidization process may be optionally performed before the insulation material is filled in the space, to entirely form a dielectric layer 370, such as a silicon oxide layer, between the fins 310 and the protrusions 330. In other words, the dielectric layer 370 is formed between the fins 310 and the insulation layer 350, and between the protrusions 330 and the insulation layer 350, such that the dielectric layer 370 may be adapted to a liner layer, but the present invention is not limited thereto. Wherein, the dielectric layer may include a single layer structure or a multi-layer structure, but not limited thereto.

As shown in FIG. 9, through the aforementioned method, the fin structure 10 having irregular shape may be formed accordingly. The fin structure 10 includes a fin 310 and a protrusion 330 formed on the substrate 100, wherein the protrusion 330 has a height at least less than ⅓ of the height of the fin 310, for example being 10 angstroms to 300 angstroms, but not limited thereto. It is worth noting that, the protrusion 330 has irregular shape. For example an overall appearance of the protrusion 310 has irregular shape or the protrusion 310 has irregular surface, particular to irregular top surface.

Figure 10:
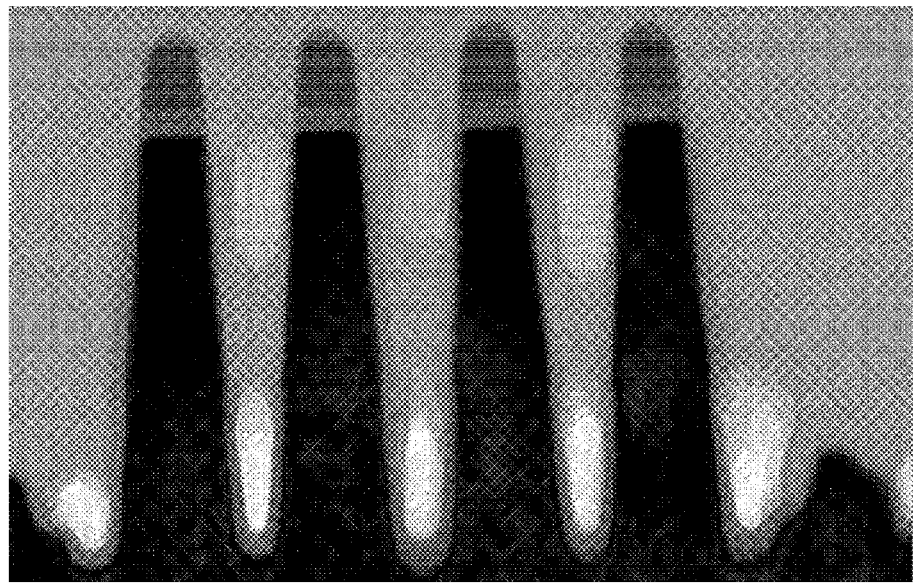
FIG. 10 is a microscope image illustrating a fin structure according to a preferred embodiment of the present invention.
Figure 10:
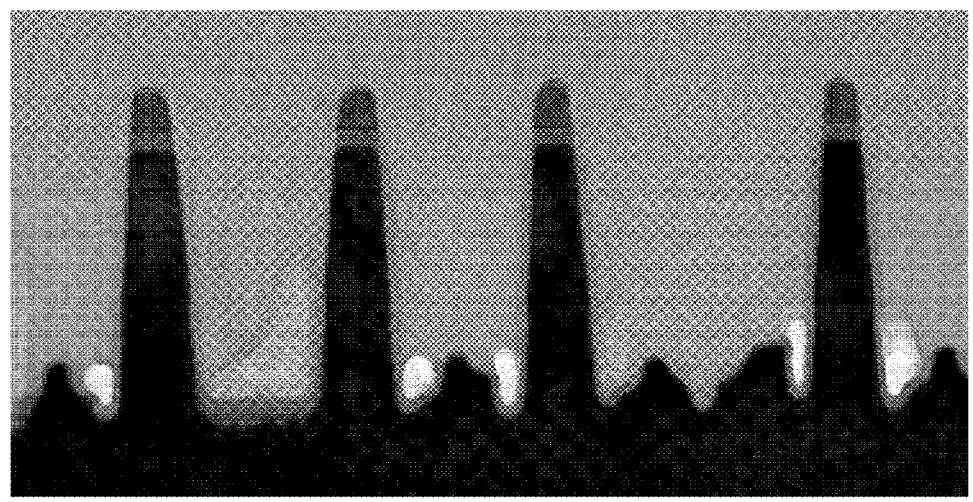

The fin structure 10 of the present embodiment further includes the insulation layer 350, entirely covering on the protrusion 330 but only partially covering each fin 310, such that a portion of the fin 310 may protrude from the insulation layer 350. Also, the insulation layer 350 further includes a void, positioned adjacent to the protrusion 330, for example, disposed between the protrusion 330 and the fin 310, or disposed adjacent to the irregular surface of the protrusion 330, but not limited thereto. Referring to FIG. 10, FIG. 10 is a microscope image illustrating a fin structure according to a preferred embodiment of the present invention. As shown in FIG. 10, voids are mainly positioned adjacent to irregular protrusions, especially adjacent to irregular surfaces of the protrusions, or between two fins. It is worth noting that, if the fin structure includes more than one fin, those voids may sufficiently isolate two adjacent fins from each other, so as to improve the efficiency of each fin.

In addition, in another embodiment, the fin structure 10 may further include the dielectric layer 370, disposed between the fin 310 and the insulation layer 350, and between the protrusion 330 and the insulation layer 350.

In summary, through the method of forming the fin structure of the present invention, the dummy fins are removed progressively, so as to improve the etching effect of the dummy fins, and to keep the fin from collapsing or over-etching during the fin cutting process. Also, through the method of the present invention, the fin structure having irregular shape may be formed, the fin structure includes irregular protrusion and voids which may effectively isolate two adjacent fins from each other, such that the fin structure will achieve better efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A fin structure, comprising:
a fin, disposed on a substrate; and
a protrusion, disposed on the substrate, wherein the protrusion has an irregular sawtooth top surface with multi-step heights, and a height of the protrusion is smaller than a height of the fin.
2. The fin structure according to claim 1, wherein the height of the fin is at least three times greater than the height of the protrusion.
3. The fin structure, according to claim 1, wherein the height of the protrusion is between 10 angstroms and 300 angstroms.
4. The fin structure, according to claim 1, wherein the fin structure further comprises an insulation layer, disposed between the fin and the protrusion.
5. The fin structure, according to claim 4, wherein the insulation layer covers the protrusion, and a portion of the fin protrudes from the insulation layer.
6. The fin structure, according to claim 4, wherein the insulation layer further comprises an enclosed void, between the fin and the protrusion.
7. The fin structure, according to claim 4, further comprising a dielectric layer, disposed between the insulation layer and the fin, and between the insulation layer and the protrusion.
8. The fin structure, according to claim 1, wherein an overall appearance of the protrusion is irregular.
9. A method of forming a fin structure, comprising:
forming a first fin and a second fin on a substrate;
performing a first etching process to remove a portion of the second fin;
performing a second etching process to remove another portion of the second fin and to form an irregular shape on the second fin; and
performing a third etching process to further remove another portion of the second fin and to form a protrusion, wherein the protrusion has an irregular sawtooth top surface with multi-step heights and a height smaller than a height of the first fin.

10. The method of forming a fin structure, according to claim 9, further comprising:
forming a hard mask layer on the substrate, the hard mask layer being on the first fin and the second fin.

11. The method of forming a fin structure, according to claim 10, further comprising:
forming an organic dielectric layer on the substrate, the organic dielectric layer covering on the first fin and the second fin; and
removing a portion of the organic dielectric layer covered on the second fin and a portion of the hard mask layer on the second fin.

12. The method of forming a fin structure, according to claim 9, wherein the first etching process is performed by using a first etchant, and the first etchant comprises carbon tetrafluoride, trifluoromethane, difluoromethane, or fluoromethane.

13. The method of forming a fin structure, according to claim 9, wherein the second etching process is performed by using a second etchant, wherein the second etchant has a higher selectivity relative to the second fin.

14. The method of forming a fin structure, according to claim 13, wherein the second etchant comprises HBr, HCl, $Cl_2$, $Br_2$ or a composition thereof.

15. The method of forming a fin structure, according to claim 12, wherein a third etching process is performed by using a third etchant, and the third etchant is the same as the first etchant.

16. The method of forming a fin structure, according to claim 9, further comprising:
forming an insulation layer after performing the first etching process, the second etching process and the third etching process, wherein the insulation layer is formed between the first fin and the protrusion and covers the protrusion, and a portion of the first fin protrudes from the insulation layer.

17. The method of forming a fin structure, according to claim 16, wherein the forming of the insulation layer further comprises:
forming an insulation material layer on the substrate, covering the first fin and the protrusion; and
removing a portion of the insulation material layer to form the insulation layer.

18. The method of forming a fin structure, according to claim 16, further comprising:
forming a dielectric layer between the insulation layer and the first fin, and between the insulation layer and the protrusion.

19. A fin structure, comprising:
a fin, disposed on a substrate;
a protrusion, disposed on the substrate, wherein the protrusion has an irregular sawtooth top surface with multi-step heights and a height smaller than a height of the fin; and
an insulation layer, disposed between the fin and the protrusion, wherein the insulation layer comprises an enclosed void, between the fin and the protrusion, and adjacent to the substrate.

* * * * *